United States Patent [19]
Macks

[11] Patent Number: 5,313,112
[45] Date of Patent: May 17, 1994

[54] LOW VOLTAGE INHIBITING CIRCUIT FOR A MICROCOMPUTER

[75] Inventor: Harold R. Macks, Detroit, Mich.

[73] Assignee: Ford Motor Company, Dearborn, Mich.

[21] Appl. No.: 812,457

[22] Filed: Dec. 23, 1991

[51] Int. Cl.⁵ .................. H03K 3/01; H01H 37/76; G06G 7/10

[52] U.S. Cl. ................... 307/296.3; 307/272.3; 307/202.1; 307/491

[58] Field of Search ............. 307/272.3, 296.1, 296.6, 307/442

[56] References Cited

U.S. PATENT DOCUMENTS

| | | | |
|---|---|---|---|
| 3,703,648 | 11/1972 | Wrabel | 307/293 |
| 4,296,338 | 10/1981 | Thomas | 307/362 |
| 4,367,423 | 1/1983 | Hornung | 307/597 |
| 4,385,243 | 5/1983 | Suzuki | 307/350 |
| 4,429,236 | 1/1984 | Nitschke | 307/362 |
| 4,433,390 | 2/1984 | Carp et al. | 364/900 |
| 4,434,403 | 2/1984 | Chang | 328/120 |
| 4,493,000 | 1/1985 | Edwards | 361/92 |
| 5,111,067 | 5/1992 | Wong et al. | 307/272.3 |
| 5,140,178 | 8/1992 | Yoshihara et al. | 307/272.3 |
| 5,140,183 | 8/1992 | Takenaka | 307/272.3 |

*Primary Examiner*—William L. Sikes
*Assistant Examiner*—Trong Phan
*Attorney, Agent, or Firm*—Paul K. Godwin, Jr.; Roger L. May

[57] ABSTRACT

A low voltage inhibiting circuit for use with a microcomputer in which a reset signal is applied during power-up or whenever the voltage of an unregulated source to a regulated supply drops below a predetermined threshold level. The reset signal is removed whenever the voltage from the unregulated source is restored to a value which is above a second predetermined threshold value defined as being above the first threshold value and after a predetermined period of time.

9 Claims, 1 Drawing Sheet

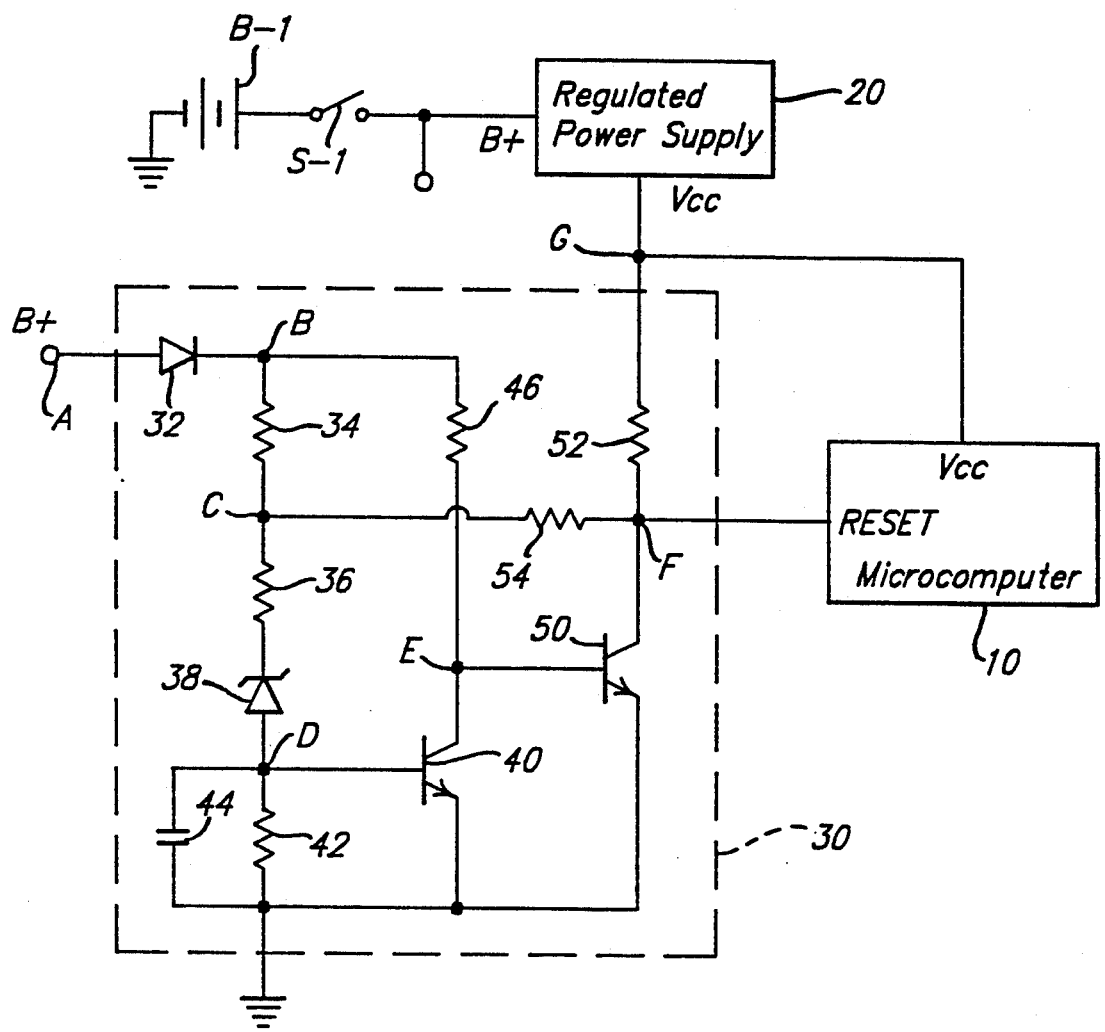

LOW VOLTAGE INHIBITING CIRCUIT FOR A MICROCOMPUTER

BACKGROUND OF THE INVENTION

1. Field of the Invention

The present invention is directed to the field of reset circuits for use with microcomputers and more specifically to the area to reset circuits that provide an inhibiting reset signal to a microcomputer when power source voltage drops below a safe level.

2. Description of the Prior Art

It is well known that microcomputers operating from regulated power supplies must be inhibited during both the power-up phase and in the event that the DC power to the regulated power supply is interrupted or drops below a predetermined level.

Prior art circuits such as those shown in U.S. Pat. No. 4,367,423 provide complicated circuits that generate reset signals for a microprocessor during the time the circuit is initially powered up or when the unregulated source voltage drops below a preselected level. Generally such prior art circuits are expensive and constitute a significant drain on a battery source.

The primary objective of people working in this area is to find a low cost solution to achieving the desired functions.

Summary of the Invention

The present invention is an improvement over the prior art. It provides a low cost, low voltage detection circuit with temperature stability and low power consumption characteristics for use in conjunction with a microcomputer. The circuit provides reset signals of at least a predetermined duration to the microcomputer during power-up and in the event of a low voltage condition occurring in an associated DC power source. During a low voltage condition, the present invention continues to apply the reset signal to the associated microprocessor until the voltage is sufficiently low enough that the microprocessor cannot attempt to operate with such power applied. In addition, the present invention has hysteresis characteristics of different reset and nonreset threshold levels. In particular, a first threshold level is defined as that which the power source voltage must fall below in order for the circuit to apply the reset signal from the microcomputer. A second, slightly higher threshold level is defined as that which the power source voltage needs to exceed in order for the circuit to remove the reset signal from the microcomputer.

It is an object of the present invention to provide an improved circuit which minimizes the electrical components necessary to provide low voltage inhibiting of a microcomputer.

It is another object of the present invention to provide a single circuit which has hysteresis characteristics that are employed while monitoring voltage of an associated power source and provides a reset signal to a microcomputer having a duration that is at least equal to a minimum predetermined time period.

It is a further object of the present invention to provide a low voltage detection circuit that is thermally compensated to maintain threshold stability over a wide range of operating temperatures.

It is another object of the present invention to provide a low voltage detection and reset circuit that draws significantly less current than those known in the prior art.

BRIEF DESCRIPTION OF THE DRAWING

The drawing is a schematic diagram of the present invention.

DETAILED DESCRIPTION OF THE PREFERRED EMBODIMENT

In the drawing, a microcomputer 10 is shown having a power input terminal $V_{cc}$ that is connected to receive a regulated voltage from a regulated power supply 20. This embodiment, as well as most applications in an automotive vehicle electronics environment, requires the value of $V_{cc}$ to be 5.0 volts. The regulated power supply 20 receives its unregulated B+ power from a battery B-1. In the drawing, a switch S-1 is shown to symbolize the fact that the regulated power supply 20 can be selectively energized by the battery B-1. In the embodiment, the battery B-1 is ideally charged to a voltage of between 12 and 14 volts DC by a conventional charging device, such as, an alternator/regulator system (not shown). Of course, other loads may be switchably connected to the battery B-1 by conventional switching systems.

The low voltage inhibiting circuit 30 is shown as having a terminal A connected to receive unregulated B+ power. A blocking diode 32 is in series with a voltage divider network comprising resistors 34 and 36, a Zener diode 38 and resistor 42. A node B is defined between the cathode of diode 32 and resistor 34. The voltage divider network, therefore, is seen as being connected between node B and ground.

An NPN transistor switch 40 is connected with its base-emitter path in parallel with resistor 42. In that configuration, the base of transistor switch 40 is connected to a defined node D between the anode of Zener diode 38 and resistor 42. The emitter of transistor switch 40 is connected to ground. A resistor 46 is connected between node B and the collector of transistor switch 40 at a defined node E.

A capacitor 44 is also connected in parallel with resistor 42 and the base of transistor switch 40, between node D and ground.

An NPN transistor switch 50 is connected with its base-emitter path in parallel with the collector-emitter path of transistor switch 40; that is, the base of transistor 50 is connected to node E and the emitter is connected to ground. The collector of transistor switch 50 is connected to a dropping resistor 52 at a defined node F. The other side of resistor 52 is connected to the $V_{cc}$ output on the regulated power supply 20 at terminal G. A threshold feedback resistor 54 is connected between node C of the voltage divider network and the collector of transistor switch 50, at node F.

In operation, the circuit 30 provides a relatively low (ground level) reset signal to the microcomputer 10 for a predetermined period of time during the power-up phase, when switch S-1 is initially closed and again, if during operation, the B+ voltage level drops below a critical value above the minimum value which would adversely affect the output of the regulated power supply 20.

When the voltage is initially applied to the regulated power supply 20, an internal clock of the microcomputer 10 must have time to stabilize. In the present embodiment, a period of approximately 400 usec. was deemed to be a sufficient time delay period for the initial reset signal application to the microcomputer 10. This initial time delay period is dictated by the time constant attributed to the selected values of resistor 34, resistor 36 and capacitor 44.

During that initial period, (assuming B+ voltage level at terminal A is above 7.5 volts) there is sufficient current flowing in the voltage divider that Zener diode 38 regulates and allows reverse current to flow. The capacitor 44 is initially discharged and makes node D appear as an effective ground. That causes transistor switch 40 to be biased in a nonconducting "OFF" state. When the transistor switch 40 is biased in its OFF state, transistor 50 is biased in its conducting "ON" state thereby providing a low or ground level signal at node F. This low level signal is the reset signal applied to the microcomputer 10. Until the capacitor 44 charges sufficiently to bias the transistor switch 40 to its conducting "ON" state, the reset signal will continue to be applied to the microcomputer 10. Once transistor switch 40 switches to its ON state, transistor switch 50 will be biased into its nonconducting "OFF" state and the voltage applied at node F will be approximately equal to $V_{cc}$ (a nonreset level).

Under normal operation, the B+ voltage is maintained at approximately 14 volts. During such operation, 13.3 volts is present at node B due to the 0.7 volt drop across diode 32. Current flow through the voltage divider provides a value of approximately 10.0 volts at node C and approximately 6.8 volts at the cathode of Zener diode 38. That is sufficiently high enough to cause Zener diode 38 to support a reverse current flow and regulate the voltage drop across it to 6.2 volts. That leaves the level at node D at approximately 0.6 volts. That voltage at node D is sufficient to continue biasing the transistor switch 40 in its ON state and hold node E (the base of transistor switch 50) at approximately ground potential. This condition holds transistor switch 50 in its OFF state and continues to provide a nonreset signal on node F at a relatively high value, approximately equaling $V_{cc}$. Because of the difference of potential between node C and node F (approximately 5.0 volts), a small amount of current flows through feedback resistor 54 to the power supply 20 while transistor switch 50 is OFF.

The nonreset level is normally continually applied until the switch S-1 is opened and the power source B-1 is disconnected from the circuit. However, there are those instances where the unregulated DC power source B-1 may become discharged because of overuse or a defective charging system, or may become otherwise overloaded for short periods that will affect the microcomputer operation. In such cases, when the power source B-1 does not supply adequate voltage to the regulated power supply to keep $V_{cc}$ at the required level to reliably power the microcomputer 10 the circuit 30 immediately provides a reset signal to microcomputer 10. In the present embodiment, the critical voltage level is 6.0 volts of B+ applied to the regulated power supply in order for it to maintain $V_{cc}$ equal to 5.0 volts. If B+ falls below 6.0 volts, the $V_{cc}$ will be affected and the operation of the microcomputer 10 will also be adversely affected. Therefore, the present embodiment of the low voltage inhibiting circuit 30 is designed to provide a reset signal to the microcomputer 10 for at least a predetermined period of time, each time the B+ voltage falls below 7.5 volts.

If the B+ level from the battery B-1 drops below a minimum threshold level (7.5 volts in this embodiment), 6.8 volts or less will be present at node C. Concurrently, the voltage potential across the Zener diode 38 will fall below 6.2 volts at that level. Zener diode 38 ceases to conduct in the reverse direction. When that occurs, capacitor 44 instantly discharges through resistor 42 and through the base of transistor switch 40 and node D goes to ground potential. Transistor switch 40 immediately switches to its nonconducting OFF state, and transistor switch 50 switches to its conducting ON state. Also, node F is switched to an approximate ground level which places a reset signal on the reset input terminal of microcomputer 10. The reset signal is maintained until B+ drops to 1.4 volts. It is critical to hold the reset signal while B+ is greater than 2.8 volts. Otherwise, microcomputer 10 will attempt to function with a $V_{cc}$ input power as low as 2.0 volts. If the reset signal were not present at these low B+ voltages, the operation of the microcomputer would be adversely affected.

In this reset condition, the current flow from the B+ source is through the diode 32, the resistor 34, resistor 54 and transistor switch 50 to ground. The current flow through resistor 54, while the circuit 30 is outputting a reset signal, is greater than the current flow occurring through resistor 54 when the circuit is outputting a nonreset signal. As such, the voltage present at node C is approximately 0.1 volt less, at 6.7 volts. Therefore, in order to have the Zener diode 38 conduct again, the B+ voltage has to be brought back up to at least 7.6 volts, which makes 6.8 volts appear at node C and provide the 6.2 volts needed to be dropped across the Zener diode 38. When 6.2 volts is dropped across the Zener diode 38, it will reverse conduct and cause switching transistor 40 to be biased in its conducting state.

The connection of the resistor 54 between node C and node F feeds back a threshold level shift of approximately 0.1 volts so that even though the reset signal will be provided to the microcomputer 10 when the B+ voltage drops to 7.5 volts, the reset signal will not be inhibited until the B+ voltage is restored to at least 7.6 volts. The difference in threshold levels is commonly referred to as a hysteresis characteristic and prevents the circuit from switching the reset signal on and off if the B+ voltage were to hover around 7.5 volts.

In addition to the hysteresis effect of the low voltage inhibitor circuit 30, the use of capacitor 44 between node D and ground takes a predetermined amount of time to charge, based upon the resistance in series with the capacitor. That charge period Provides the reset signal with a duration at least equal to the RC time constant that is required in order to again bias the transistor switch 40 from its OFF state to its ON state. In this case, the period is on the order of 70 usec. By being able to provide a reset signal that is at least of a predetermined time period, the microcomputer 10 is able to determine whether the reset signal on the reset terminal is one which occurs from the low voltage inhibitor circuit 30 or from some internal reset circuit where such signals have a lesser duration.

The temperature coefficients of Zener diode 38 and of diode 32 are selected to be equal and opposite in order to provide offsetting to one another throughout a defined range of operating temperatures This provides circuit 30 with extremely high tolerance to temperature changes. Over the typical automotive temperature range of $-40°$ C. to $+85°$ C., the minimum threshold of B+ that causes a reset signal to be present at the reset input terminal of the microcomputer and the corresponding nonreset threshold vary by only ±0.12 volts.

The circuit 30 has been crafted to allow it to function in applications where low current consumption is necessary. Circuit 30 current consumption will be less than 1.0 ma when B+ is 14V. This low current draw makes circuit 30 functional and highly desirable in battery powered source applications.

It will be apparent that many modifications and variations may be implemented without departing from the scope of the novel concept of this invention. Therefore, it is intended by the appended claims to cover all such modifications and variations which fall within the true spirit and scope of the invention.

I claim:

1. A circuit for inhibiting the operation of a microcomputer by applying a reset signal to a reset terminal of said microcomputer when voltage supplied by a DC source to a regulated power supply that is connected to said microcomputer drops below a first threshold level corresponding to a first predetermined minimum value, and for removing said reset signal following said voltage from said DC source being raised to a value that is above a second threshold level corresponding to a second predetermined minimum value that is greater than said first value, comprising:

a first voltage sensing means connected between said DC source and ground for providing a first output signal level when said DC source voltage is sensed as having raised above said second threshold level and remains continuously above said first threshold level and for providing a second output signal level that is distinguishable from said first output signal when said DC source voltage is sensed as having dropped below said first threshold level;

a second voltage sensing means connected between said regulated power supply and ground, and to said first voltage sensing means to provide a nonreset signal level to said reset terminal when said first output signal level is present and a reset signal when said second output signal level is present; and feedback means connected between said first and second means for causing said first means to sense when said DC source voltage is raised above said second threshold level when said reset signal is provided by said second means and causing said first means to sense when said DC source voltage drops below said first threshold level when said nonreset signal level is provided.

2. A circuit as in claim 1, wherein said second means provides a reset signal for a duration that is at least equal to a predetermined minimum time period.

3. A circuit as in claim 2, wherein said first threshold level is defined to be greater than that level of voltage supplied to said regulated power supply which would affect the value of voltage supplied to said microprocessor.

4. A circuit as in claim 3, wherein said first voltage sensing means contains diode elements having equal and opposite temperature coefficient characteristics connected to provide thermal compensation to said first and second threshold levels over a predetermined temperature range.

5. A circuit as in claim 4, wherein said threshold defining means includes a Zener diode connected in a series voltage divider between said DC source and ground.

6. A circuit for resetting a microcomputer when the voltage level of an associated DC source, connected to power a regulated power supply for the microcomputer, drops below a first predetermined threshold level, comprising:

means for monitoring the voltage level of said associated DC source;

means within said monitoring means for defining a first threshold level associated with said monitored voltage and a second threshold level, slightly greater than said first threshold level; and means connected to said threshold defining means and providing a reset signal to a microcomputer when said monitored voltage level drops below a first defined threshold level and removing said reset signal when said monitored voltage level returns to a level that is above said second defined threshold level.

7. A circuit as in claim 6, wherein said monitoring means contains diode elements having equal and opposite temperature coefficient characteristics connected to provide thermal compensation to said first and second predetermined threshold levels over a temperature range.

8. A circuit for resetting a microcomputer when the voltage level of an associated DC source, connected to power a regulated power supply for the microcomputer, drops below a first predetermined threshold level, comprising:

a voltage dropping network connected between said DC source and ground, including a plurality of resistors and at least one Zener diode connected in series;

a first switching transistor having a base terminal connected to a junction formed between the Zener diode and one of the resistors and a collector-emitter path connected between the DC source and ground;

a second switching transistor having a base terminal connected to a nongrounded terminal of said switching transistor in its first collector-emmiter path and the collector-emitter path of said second switching transistor connected between the regulared power supply and ground;

wherein said reset terminal of said microcomputer is connected to a nongrounded terminal of said second switching transistor.

9. A circuit as in claim 8, wherein said voltage dropping network contains a diode element having an equal and opposite temperature coefficient characteristic to that of the Zener diode and connected in said network to provide thermally compensated stability to said first and second threshold levels over a predetermined temperature range.

* * * * *